(12) United States Patent
Bluck et al.

(10) Patent No.: US 11,897,811 B2
(45) Date of Patent: Feb. 13, 2024

(54) SYSTEM FOR FORMING NANO-LAMINATE OPTICAL COATING

(71) Applicant: INTEVAC, INC., Santa Clara, CA (US)

(72) Inventors: Terry Bluck, Santa Clara, CA (US); Wendell Thomas Blonigan, Pleasanton, CA (US)

(73) Assignee: INTEVAC, INC., Santa Clara, CA (US)

(*) Notice: Subject to any disclaimer, the term of this patent is extended or adjusted under 35 U.S.C. 154(b) by 0 days.

(21) Appl. No.: 17/589,498

(22) Filed: Jan. 31, 2022

(65) Prior Publication Data
US 2022/0185726 A1 Jun. 16, 2022

Related U.S. Application Data

(62) Division of application No. 16/040,468, filed on Jul. 19, 2018, now Pat. No. 11,236,013.

(Continued)

(51) Int. Cl.
*C23C 14/34* (2006.01)
*C03C 17/34* (2006.01)
(Continued)

(52) U.S. Cl.
CPC ......... *C03C 17/3417* (2013.01); *B05D 5/063* (2013.01); *B32B 17/10174* (2013.01); *C03C 17/3441* (2013.01); *C03C 17/3482* (2013.01); *C03C 17/42* (2013.01); *C08J 7/0423* (2020.01); *C23C 14/0052* (2013.01); *C23C 14/0089* (2013.01); *C23C 14/081* (2013.01); *C23C 14/10* (2013.01); *C23C 14/3442* (2013.01); *C23C 14/3464* (2013.01); *C23C 14/505* (2013.01); *C23C 14/548* (2013.01); *C23C 14/568* (2013.01); *G02B 1/111* (2013.01);
(Continued)

(58) Field of Classification Search
None
See application file for complete search history.

(56) References Cited

U.S. PATENT DOCUMENTS

2006/0285945 A1* 12/2006 Hofmeister ....... H01L 21/67742
414/217
2016/0023941 A1* 1/2016 Brown ................ C23C 14/0036
428/408

* cited by examiner

*Primary Examiner* — Jason Berman
(74) *Attorney, Agent, or Firm* — Womble Bond Dickinson (US) LLP; Joseph Bach, Esq.

(57) ABSTRACT

A processing system for forming an optical coating on a substrate is provided, wherein the optical coating including an anti-reflective coating and an oleophobic coating, the system comprising: a linear transport processing section configured for processing and transporting substrate carriers individually and one at a time in a linear direction; at least one evaporation processing system positioned in the linear transport processing system, the evaporation processing system configured to form the oleophobic coating; a batch processing section configured to transport substrate carriers in unison about an axis; at least one ion beam assisted deposition processing chamber positioned in the batch processing section, the ion beam assisted deposition processing chamber configured to deposit layer of the anti-reflective coating; a plurality of substrate carriers for mounting substrates; and, means for transferring the substrate carriers between the linear transport processing section and the batch processing section without exposing the substrate carrier to atmosphere.

6 Claims, 10 Drawing Sheets

Related U.S. Application Data

(60) Provisional application No. 62/651,617, filed on Apr. 2, 2018, provisional application No. 62/534,438, filed on Jul. 19, 2017.

(51) Int. Cl.
| | |
|---|---|
| *C23C 14/54* | (2006.01) |
| *C23C 14/00* | (2006.01) |
| *C23C 14/10* | (2006.01) |
| *C23C 14/08* | (2006.01) |
| *C23C 14/50* | (2006.01) |
| *C08J 7/04* | (2020.01) |
| *C23C 14/56* | (2006.01) |
| *H01J 37/32* | (2006.01) |
| *B05D 5/06* | (2006.01) |
| *B32B 17/10* | (2006.01) |
| *C03C 17/42* | (2006.01) |
| *G02B 1/111* | (2015.01) |
| *G02B 1/116* | (2015.01) |

(52) U.S. Cl.
CPC ........ *G02B 1/116* (2013.01); *H01J 37/32899* (2013.01); *C03C 2217/734* (2013.01); *C03C 2217/76* (2013.01)

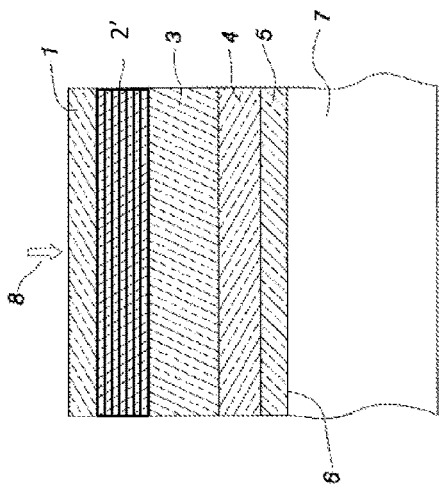
*Figure 1C*
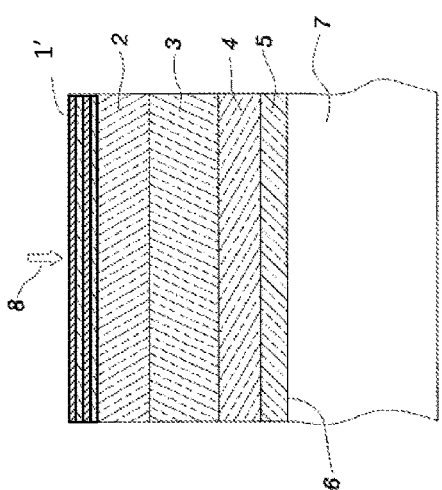
*Figure 1B*
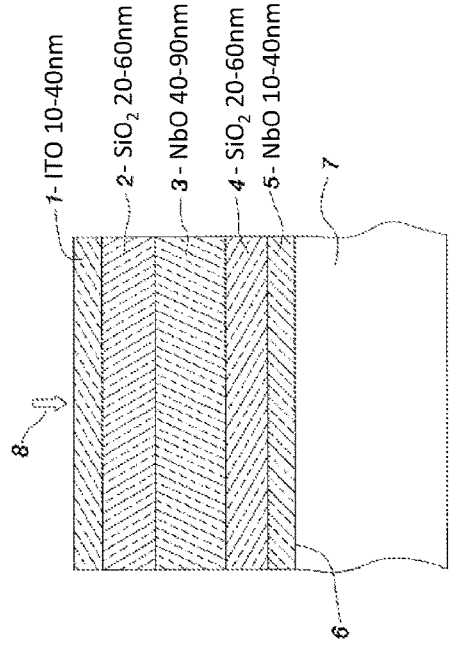
*Figure 1A*
*Prior Art*
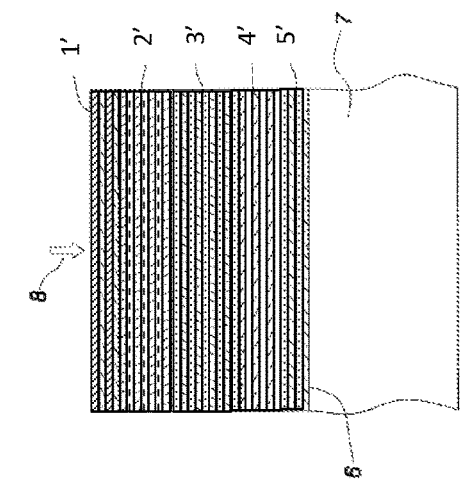
*Figure 1D*
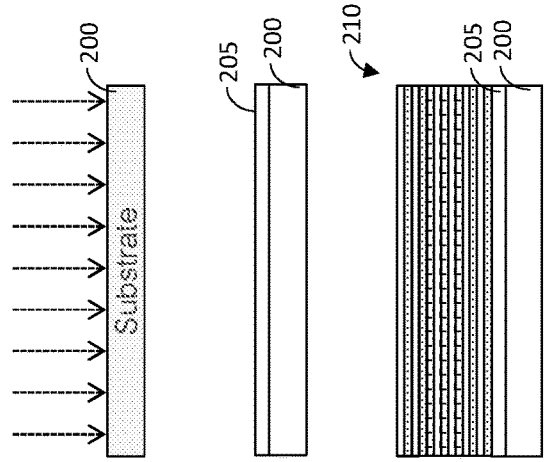
*Figure 2A*
*Figure 2B*
*Figure 2C*

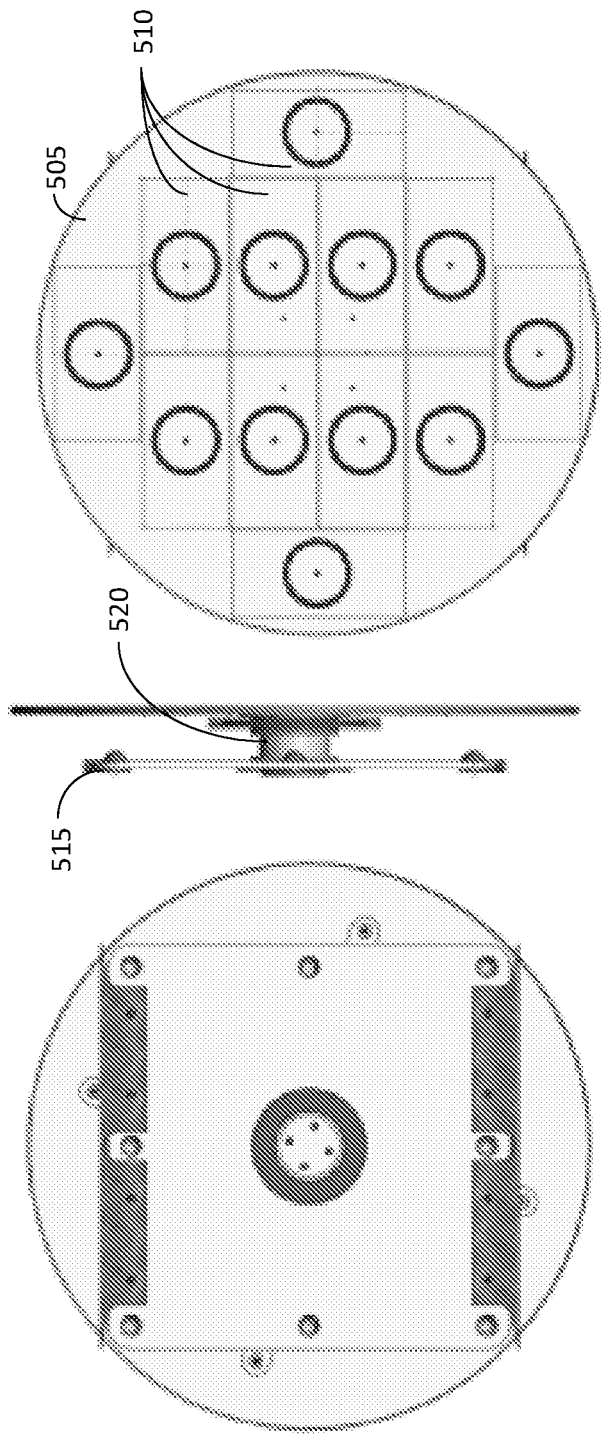

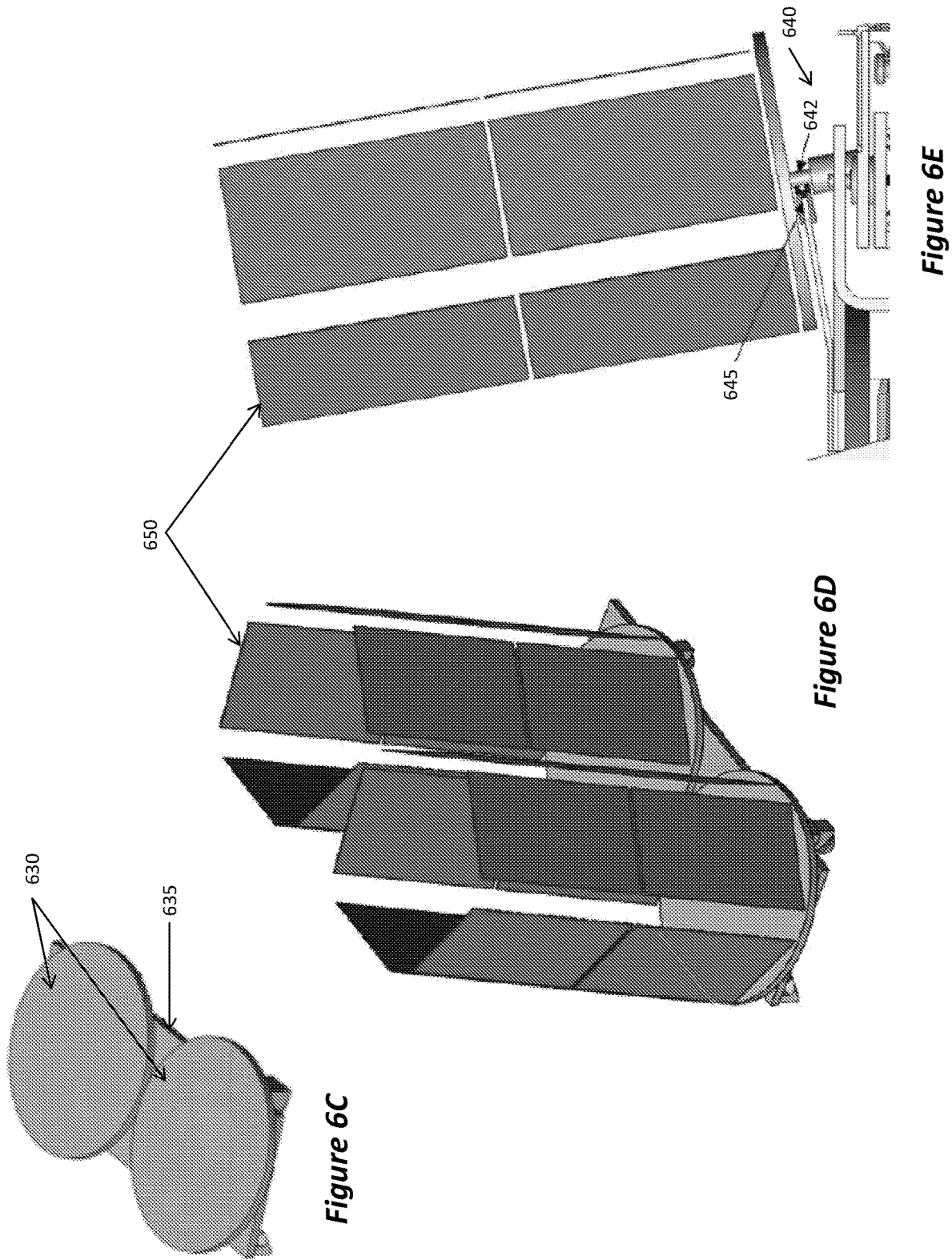

SYSTEM FOR FORMING NANO-LAMINATE OPTICAL COATING

CROSS-REFERENCE TO RELATED APPLICATIONS

This application is a divisional of co-pending U.S. application Ser. No. 16/040,468, filed on Jul. 19, 2018, which claims priority from U.S. Provisional Application No. 62/534,438, filed Jul. 19, 2017, and U.S. Provisional Application No. 62/651,617, filed Apr. 2, 2018, the disclosures of which are incorporated herein by reference in their entireties.

BACKGROUND

1. Field

This disclosure relates generally to the field of optical coatings, such as anti-reflective coating, and to the manufacturing of such optical coating.

2. Related Art

Anti-reflective coatings (ARC) are used for many applications, such as, e.g., spectacles, plate glass (e.g., car windshield), flat-screen displays, and touch screens. In many of these applications, the requirements on the ARC include efficient anti-reflective property in the visible wavelength, high transparency, and durability. Of course, these properties need to be achieved in a commercially acceptable cost.

In general, there are two methods for forming an ARC on a substrate, a wet and a dry method. The dry method uses deposition or sputtering to laminate a plurality of thin layers of alternating high and low refractive index. This method offers superior adhesion at inter-layer interfaces and highly accurate control of layers' thicknesses, but requires relatively high production cost. The wet method involves coating the substrate with a wet solution and thereafter drying the solvent. In this method as well, alternating layers of low and high refractive index are formed, so that the process needs to be repeated leading to relatively weak adhesion at the layer's interface, as compared with the dry method.

Examples of wet and dry methods for forming ARC are described in, for example, U.S. Pat. Nos. 9,482,789, 8,358,467, 6,532,112, and 5,106,671.

One problem with conventional ARC is that most high volume, cost competitive methods of creating ARC's do not create a scratch or wear resistant enough coating to be used on devices that are subject to continuous use or used in harsh environments. Mobile devices such as cell phones are an example of an application that cannot be served by conventional ARC coatings. The reason is that any damage to the ARC strongly refracts the light emitted by the screen, thus creating a very visible defect in the device. This highly visible defect obviates the anti-reflecting benefit of the AR coating.

Also, the stress in the films used in optical stacks, like the multiple layers creating an AR or color coating, can be very high. This can create an increase in breakage if the device is dropped or receives an impact to the glass surface. Breakage is large cause of warranty returns for mobile device manufacturers and the risk of increased breakage makes the use of the films undesirable to the manufacturer.

Accordingly, a need exists in the art for improved ARC, which can be used, e.g., in flat panel displays and touch-screens. Moreover, there's a need in the art for machinery that can form the improved coating at high throughput and a commercially acceptable cost.

SUMMARY OF THE INVENTION

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Disclosed embodiments provide a system specifically designed to form an improved optical coating structure having improved optical and mechanical properties, especially high durability and resistance to scratches. The disclosed embodiments utilize manufacturing methods that can be implemented in high volume manufacturing at an acceptable commercial cost.

In the disclosed embodiments the optical coating, e.g., ARC, is formed using a plurality of superlattices, also referred to as nano-laminates, each having nano-layers of alternating refractive index, to create an improved ARC structure. Each superlattice consists of at least two nm-scale layers (i.e., one bi-layer) with alternating compositions and/or crystalline phases, but matching refractive index. The plurality of superlattices are stacked with alternating effective refractive index. The effective refractive index of a superlattice is the average refractive indexes of the two nano-layers making up the bi-layer, weighted by the nano-layers' thicknesses. In the disclosed embodiments each of the nano-layers is of thickness of no more than 30 nanometer, and more typically in the range of 2-10 nm. In some embodiments the entire ARC structure is made of nano-layers. In alternative embodiments a standard ARC layer is formed, wherein one, typically the last, optical layer is made of multiple nano-layers, forming a hard cap layer.

In general aspects, a processing system for forming an optical coating on a substrate is provided, wherein the optical coating including an anti-reflective coating and an oleophobic coating, the system comprising: a linear transport processing section configured for processing and transporting substrate carriers individually and one at a time in a linear direction; at least one evaporation processing system positioned in the linear transport processing system, the evaporation processing system configured to form the oleophobic coating; a batch processing section configured to transport substrate carriers in unison about an axis; at least one ion beam assisted deposition processing chamber positioned in the batch processing section, the ion beam assisted deposition processing chamber configured to deposit layer of the anti-reflective coating; a plurality of substrate carriers for mounting substrates; and, means for transferring the substrate carriers between the linear transport processing section and the batch processing section without exposing the substrate carrier to atmosphere.

In one embodiment the batch processing section comprises a planetary processing chamber, wherein a plurality of carriers are rotated about an axis of the planetary processing chamber, while each carrier also spins about its own axis. In another embodiment the batch processing system comprises a plurality of processing chambers arranged in two rows in a back-to-back orientation, and a conveyor belt passing through the plurality of chambers forming a race track, the conveyor belt engaging the plurality of substrate carriers and moving the plurality of substrate carriers together in unison around the race track.

Disclosed embodiments include a method for forming an optical coating, comprising: providing a transparent substrate; forming a plurality of transparent layers over the substrate by alternatingly forming a first refractive index layer having a first refractive index and a second refractive index layer having a second refractive index a plurality of times; wherein forming a plurality of transparent layers comprises forming at least one layer by: placing the transparent substrate in a sputtering chamber; activating the sputtering chamber to form at least one bi-layer of two nano-layers of different materials, each of the nano-layers having a thickness of 2-10 nanometer, each of the nano-layer formed by sputtering material from a target while simultaneously implanting oxygen or nitrogen ions onto a nano-layer formed over the substrate. The method may further comprise forming a seed layer directly onto the substrate prior to forming the plurality of transparent layers. The method may also comprise forming a diamond-like coating over the plurality of transparent layers. The method may also comprise forming a silicon layer over the diamond-like coating, forming silicon-oxide layer over the silicon layer, and forming anti-finger print layer over the silicon-oxide layer. The method may further include selecting the different materials to have refractive indexes $n_1$ and $n_2$ such that the relationship $(n_1-n_2)/(n_1+n_2) \leq 0.07$ is satisfied. The method may further include forming the plurality of transparent layers such that the relationship $(n_f-n_s)/(n_f+n_s) \geq 0.10$ is maintained, wherein of is the effective refractive index of the bi-layer and $n_s$ is the refractive index of one of the first refractive index or the second refractive index.

BRIEF DESCRIPTION OF THE DRAWINGS

Other aspects and features of the invention would be apparent from the detailed description, which is made with reference to the following drawings. It should be appreciated that the detailed description and the drawings provides various non-limiting examples of various embodiments of the invention, which is defined by the appended claims.

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1A illustrates a prior art ARC structure disclosed in U.S. Pat. No. 6,532,112, while FIGS. 1B-1D illustrate modified ARC structures according to embodiments of the invention.

FIGS. 2A-2C illustrate a process for forming an optical coating according to one embodiment.

FIGS. 5A-5D illustrate an embodiment of the carrier that may be used in the system of FIGS. 4A-4C.

FIGS. 6C-6E illustrate an embodiment of the carrier that may be used in the system of FIGS. 6A and 6B.

DETAILED DESCRIPTION

Figures 3A, 3B:
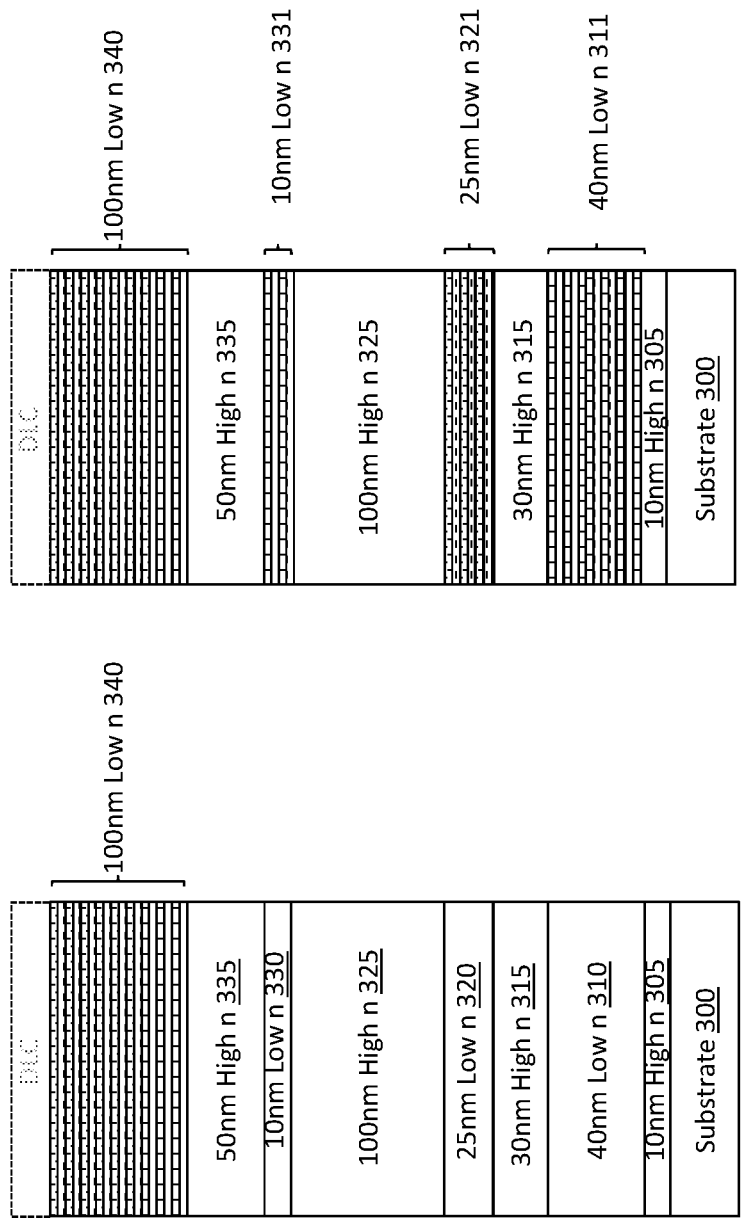
FIGS. 3A-3C illustrate yet more embodiments of the optical coating.

Embodiments of the inventive system for fabricating optical coating and its processing will now be described with reference to the drawings. Different embodiments or their combinations may be used for different applications or to achieve different benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments.

Disclosed embodiments include systems and methods for forming optical coating having a nano-laminate structure. In the context of this disclosure, the nano-laminates are alternating nano-layers of different composition, each nano-layer having a thickness of no more than 30 nm. In various disclosed embodiments, beneficial results are shown when each nano-layer is 2-10 nm thin. The corrosion, wear, scratch and hardness properties of the nano-laminate structure are much greater than that of the individual films or of a stack of the films in thicknesses greater than 30 nm.

According to disclosed embodiments, the ARC layers can be formed on a variety of crystalline or non-crystalline substrates, such as glass (including treated glass, such as Gorilla Glass®), sapphire, and plastic. However, in the disclosed embodiments the layers are formed while maintaining the substrate at temperatures no higher than 300° C.

The optical films typically have very high coefficient of friction, which means that while they are very hard, they can be damaged by repeated abrasive contact. In order to protect the optical coating from abrasive wear they need to be coated with a lubricious film. In disclosed embodiment is a highly hydrogenated DLC, generally having more than 20% hydrogen.

Additionally, for consumer display products finger prints degrade the visual performance of the display. The final surface on these types of products needs to have an anti-smudge or anti-fingerprint coating (also referred to as Oleophobic Coating). Oleophobic Coating are generally made with fluorocarbons; however, it is very difficult for fluorocarbon materials typically used for anti-fingerprint applications to adhere to DLC. To improve adhesion a two-layer film is used between DLC and AF coating. A thin, (about 5 angstrom), silicon film is deposited on the DLC to protect the DLC from oxygen used to create the second SiO2 layer. Consequently, the final film stack is ARC, covered by DLC, followed by Si and SiO2, and topped by AF coating.

In order to deposit these films on consumer products, such as cell phone display front and back cover glass, tablets, automotive displays or computer monitors, in a cost competitive manner, the system must be very flexible for different form factors of the substrates, but tailored to the requirements of the ion beam assisted reactive sputtered nano laminate films. That is, preferably the system should be able to just as efficiently handle small substrates—such as those used for smart watches—and large substrates—such as those used for computer touch screens.

It is necessary to obtain high throughput in excess of hundreds of substrates per hour for cell phone sized displays, with the flexibility to easily change substrate size and shape such as is required for 2d and 3d glass and other mobile displays. Mobile device displays vary in size over a considerable range and the flexibility to handle a wide range is a requirement for systems to be cost competitive in the industry.

In disclosed embodiments, the system utilizes small chambers which can be added linearly for process station expansion. The substrate is transported on a carrier which allows for quick change of substrate size and form factor without breaking vacuum. The design allows for the substrates to be rotated or oscillated as they pass thru the process chamber. Rotation is required for uniform edge coating on small 2d or 3d substrates. Oscillation is required for larger 2d substrates that are too large to rotate thru the chamber. Oscillation allows the leading edge and trailing edge of the substrates to be angled toward the deposition source for the correct amount of time to uniformly coat the edges and surface.

In the batch portion of the system the carrier travels repeatedly thru the deposition chambers on a monorail transport. The carriers are propelled by a belt system driven by a single motor. After the total batch multi-layer process is done, the carriers enter and exit the batch process chamber one at a time through locks. In this portion of the system the carriers are still on a monorail but are driven individually by magnetic drive wheels. After all the carriers are exchange into and out of the batch chamber, the next process begins and coats all the required layers on the new substrates.

In the linear non-batch process portion of the system additional process steps can be done that are not compatible with the high vacuum, high purity, low particle batch chamber. Processes like the evaporative anti finger print coatings applied as the last layer on mobile displays require vacuum isolation between processes.

In disclosed embodiments, the processing system includes both a linear motion section and a planetary motion section, wherein substrates are transported between the two sections without breaking vacuum. The substrates are mounted on substrate carriers that serve for both the linear motion section and the planetary batch processing section. In some disclosed embodiments the carriers move in unison while in the batch processing section, but move individually while in the linear motion section. While inside the batch processing system the carriers are rotated around the center axis of the chamber and also rotate about their own axis. In the batch chamber the substrates move past several magnetrons or Ion sources. This allows for ion beam assisted deposition (IBAD) or Metamode processing to deposit many alternating layers of oxides, nitrides, oxynitrides, etc.

Prior to describing the embodiments of the processing system, below is a description of the film structure sought to be formed as glass coating.

FIG. 1A illustrates an ARC structure disclosed in U.S. Pat. No. 6,532,112, while FIGS. 1B-1D illustrate modified ARC structures according to embodiments of the invention. As disclosed by the prior art, the ARC layer shown in FIG. 1A consists of alternating layers of oxide materials having different index of refraction. Thus, in the example of FIG. 1A, layers 2 and 4 are made of SiO2 having refractive index of 1.45-1.50, while layers 3 and 5 are made of NbO having refractive index of 2.1-2.3. The arrangement is capped by an ITO layer having refractive index of 1.9-2.1 at the wavelength of 520 nm.

The disclosed embodiments enhance the performance of the ARC structure by replacing at least one of the ARC layers with a superlattice made of alternating nano-layers of materials having effective refracting index similar to that of the replaced layer. FIG. 1B illustrates one example wherein the ITO cap layer 1 is replaced by a superlattice nano-laminate of multiple nano-layers 1'. The ITO layer 1 was reported to have a refractive index of 1.9-2.1. Accordingly, in this example the nano-layers are selected to have a similar refractive index. According to one embodiment, the ITO layer 1 is replaced by ten alternating nano-layers of SiN and AlN, each having 2.5 nm thickness, for a total of 25 nm thickness. The SiN has refractive index of 2.05 at the wavelength of 520 nm. The AlN has refractive index of 2.15 at the wavelength of 520 nm. The nano-laminate layer 1' would provide enhanced mechanical properties, making the ARC structure more durable and, as shown below, has an effective refractive index of 2.10, which is the same as that of the ITO it replaces.

FIG. 1C illustrates an embodiment wherein layer 2 is replaced by a nano-laminate structure 2'. Layer 2 was reported to have a refractive index of 1.45-1.50 at 520 nm wavelength. Accordingly, in this example the nano-layers are selected to have a similar refractive index. In this example, nano-laminate structure 2' is made up of 16 alternating layers of SiO and $Al_2O_3$, each of 2.5 nm thickness, for a total of 40 nm. SiO has a reported index of refraction of 1.46 at 520 nm wavelength, while $Al_2O_3$ has a reported index of refraction of 1.77 at 520 nm wavelength. However, when these films are formed using sputtering, as recommended in the subject disclosure, SiO has index of refraction of 1.48-1.50, while $Al_2O_3$ has index of refraction of 1.65-1.67, resulting in effective refractive index of 1.57 (see calculations below).

While each of FIGS. 1B and 1C illustrates an embodiment wherein only one layer is replaced with a nano-laminate, according to disclosed embodiments any number of layers can be replaced by nano-laminates of materials having similar refractive index. In fact, in some embodiments all of the layers may be replaced, as shown in the example of FIG. 1D.

In the example of FIG. 1D, the ITO cap layer 1 is replaced by nano-laminate layer 1' made up of ten alternating nano-layers of SiN and AlN, each having 2.5 nm thickness, for a total of 25 nm thickness. Layer 2 is replaced by nano-laminate layer 2' made up of 16 alternating layers of SiO and $Al_2O_3$, each of 2.5 nm thickness, for a total of 40 nm. Layer 3 is replaced by nano-laminate layer 3' having twenty alternating nano-layers of SiN and AlN, each having 3 nm thickness, for a total of 60 nm thickness. Layer 4 is replaced by nano-laminate layer 4' made up of ten alternating layers of SiO and $Al_2O_3$, each of 2.5 nm thickness, for a total of 25 nm. Layer 5 is replaced by nano-laminate layer 5' having six alternating nano-layers of SiN and AlN, each having 3 nm thickness, for a total of 18 nm thickness.

The materials for each layer of the nano laminate have to be chosen carefully. To function as an optical coating, the refractive index of the low AR layer nano-laminate stack should be as low as possible and the refractive index for the high AR layer nano-laminate stack should have as high as possible refractive index. However, refractive index is not the only important property. For a robust nano-laminate stack, the hardness, shear modulus and stress of the individual nano layers is critical as well. The high index nano-layers can be made of combinations of the following (stoichiometric and non-stoichiometric) optical films: ZrO, Y—ZrO, AlN, SiN, ZrN, TiO, CrO, CrN, CrTiO, and CrTiN. The low refractive index nano layers can be made from combinations of the following films: SiO, AlO, SiON, SiAlO.

In this context, it should be appreciated that the terms low refractive index and high refractive index are not used as quantitative measurement, but rather as relative descriptors enabling distinction between the alternating layers. What is important in the ARC context is not the specific values of the refractive index, but that the low refractive index layers have a refractive index value that is sufficiently lower than that of the high refractive index to bring about the required optical effect.

Also, it is important that the refractive index of the nano-layers be matched for their purpose in the optical stack. For each of the high and low nano-layers the closer the refractive index of the materials making up the two alternating nano-layers, the better the optical performance. In fact, if the refractive indexes of the two nano-layers within a nano-laminate are equal, there is no optical degradation, since the amount of light reflected at an optical interface is proportional to $(n1-n2)/(n1+n2)$. The result of $(n1-n2)/(n1+n2)$ should ideally be less than 0.07 for the nano-layers within a nano-laminate layer, and greater than 0.1 between the high and low index nano-laminate stacks.

Looking at the example of FIG. 1D, the difference of the refractive index for the high refractive index nano-laminate (e.g., layers 1', 3' and 5') is: $(n1-n2)/(n1+n2)=(2.15+2.05)/(2.15+2.05)=0.02$. The difference of the refractive index for the low refractive index nano-laminate using reported values would be: $(n1-n2)/(n1+n2)=(1.77-1.46)/(1.77+1.46)=0.09$, which is above the required 0.07. Therefore, as disclosed herein, it is advantageous to form the layers by sputtering. Using the sputtering values, one obtains $(n1-n2)/(n1+n2)=(1.67-1.48)/(1.67+1.48)=0.06$, which is within the required 0.07. The difference between the high and low is calculated by taking into account the thickness ratio of the two layers. Nano-laminate 1' has an effective refractive index of: $[(t1*n1)+(t2*n2)]/(t1+t2)$, wherein t=thickness. Thus, $[(2.5*2.05)+(2.5*2.15)]/5=2.10$. The effective refractive index of layer 2' is $[(2.5*1.48)+(2.5*1.67)]/5=1.57$. Consequently, the difference between these two layers is: $(n1-n2)/(n1+n2)=(2.10-1.57)/(2.10+1.57)=0.14$.

Incidentally, while in the examples of FIGS. 1B-1D all of the nano-layers within a nano-laminate have the same thickness, this doesn't need to always be the case. For example, the effective refractive index of layer 1' can be increased by making the AlN nano-layer thicker than the SiN nano-layer. For example, the AlN can be set to 6 nm and the SiN to 3 nm, in which case the effective refractive index would be: $[(3*2.05)+(6*2.15)]/9=2.12$. Similarly, to lower the effective refractive index of layer 2', one may set: $[(5.5*1.46)+(2.0*1.67)]/7.5=1.52$.

As can be seen from the above disclosure, each nano-laminate comprises multiple nano-layers made up of two different materials of similar refractive index, wherein the nano-layers are stacked alternatingly. Thus, one can speak of bi-layers, wherein each bi-layer is a stack of two nano-layers, each made of different materials, but having similar refractive index. In this context, the reference to similar refractive index means that the value of the refractive index of one layer within a bi-layer of one nano-laminate is closer to the refractive index value of the other nano-layer within the bi-layer than to the refractive index of nano-layers within a different nano-laminate. That is, the two materials making up the bi-layer of low refractive index nano-laminate have values closer to each other than to the refractive index of any of the bi-layers making up the high refractive index nano-laminate.

Generally, to improve the corrosion, wear, scratch and hardness of the coating, the bilayers are made of nano-layers each having thickness from 2-10 nanometers. The bi-layers are used to form a plurality of nano-laminates that alternate in refractive index, so as to generate the desired optical effect. In some embodiments, a reflective coating is created. Reflective coatings can be formed, e.g., on the backside of mobile devices. In these cases, the optical stack is designed to reflect a desired color, such that the mobile device appears colored. Reflective coatings are designed in half wavelength ($\frac{1}{2}\lambda$) stacks. Conversely, antireflective coatings are formed on the display side of the mobile devices to eliminate or diminish light reflection from the screen. The antireflective coatings are designed in quarter wavelength stacks ($\frac{1}{4}\lambda$). The wavelength is the wavelength that is sought to be reflected by the stack. Thus, to create an effective ARC that reflects broad wavelengths, the multiple nano-laminates should be formed to have different thicknesses.

In disclosed embodiments the nano-layers are made of metal oxides, nitrides or oxynitrides. Some examples include: YsZ, $Al_xO_y$, AlN, $Si_xN_y$, AlSiO, and SiON. In some embodiment, an adhesion or seed layer is deposited first, and may be of materials such as ITO, SnxOy, and WOx. Also, in preferred embodiments the various layers are formed using ion beam assisted deposition (IBAD), such that the target material is made of the metal to be deposited and the oxygen or nitrogen are ion implanted during deposition. Thus, the sputtering process is performed in metal mode (also referred to as Metamode) wherein the target is sputtered as a (non-oxidized) metal, typically by Argon ions, and the very thin film that is formed on the substrate (~1 nm typically) is converted into an oxide or nitride by hitting the deposited metal with $O_2$ or $N_2$ ion beam. For example, the target for the sputtering may be made of pure silicon or aluminum, while the ion beam includes $O_2$ or $N_2$, with or without argon, to form layers of SiO, SiN, AlO, etc. Also, in preferred embodiments the ratio of ion current to atom arrival rate is less than 0.5, and the ions have potential energy no higher than 600 eV.

In some embodiments, the refractive index of any layer can be changed by alloying the material. For example, MgO can be used to alloy a high refractive index material such as ZrOx or a low index material such as AlOx. The alloying can be done by adding about 8-10% of MgO, which will lower the crystallization temperature of the layer. In another example, about 10-12% of chromium can be alloyed with titanium to improve toughness. Anatase, one of the three mineral forms of titanium dioxide, has a high refractive index of 2.4, but has low hardness, and is therefore a good candidate for alloying. Titanium itself can be used as alloying agent to change refractive index. Tantalum can be alloying agent to change properties of high refractive index material, while Boron can be alloying agent to change the properties of a low refractive index material.

FIGS. 2A-2C illustrates a process for forming an optical coating according to one embodiment. In FIG. 2A process may start by treating the surface of the substrate 200, e.g., using plasma or ion bombardment. The plasma or ion bombardment may include argon and/or hydrogen species. In FIG. 2B a seed layer 205 is formed on the surface of the substrate 200 to set crystal growth pattern and/or improve adhesion. The seed layer 205 may be of materials such as ITO, SnxOy, and WOx, and is formed using ion beam assisted deposition. In FIG. 2C the nano-laminate layers 210 are formed over the seed layer 205.

Turning to FIG. 3A, an optical coating, in this example an ARC, is illustrated, which is partially made up of standard layers and partially of nano-laminate. In this example the substrate 300 may be glass, e.g., front glass of a mobile phone or other mobile devices or touch screens. When applied onto the glass of a display, ARC can provide increased battery life and improve the visibility of the displays in bright light. However, scratches to the coating create unsightly areas on the device. This cosmetic damage is highly visible and makes the usage of these films undesirable for high wear and use applications. Also the stress in the films used in prior art optical stacks can be very high. This can create an increase in breakage if the device is dropped or receives an impact to the glass surface. Breakage is large cause of warranty returns for mobile device manufacturers and the risk of increased breakage makes the use of the films undesirable to the manufacturer. Therefore, the embodiment of FIG. 3A is provided in order to increase the durability of the coating, so that it can be used in display devices.

The coating of FIG. 3A includes multiple layers of alternating high and low refractive index. The first layer is a conventional thin layer 305 of high refractive index, having thickness of 10 nm. This layer, as well as all of the remaining high n layers, are made of $Si_3N_4$, having refractive index of 2.02. The second layer, 310, is a conventional layer of 40 nm low refractive index, in this case made of $SiO_2$, having refractive index of 1.48. This follows by a 30 nm of high n layer 315, a 25 nm layer of low n 320, a 100 nm layer of high n 325, a 10 nm layer of low n 330 and a 50 nm layer of high n 335. All of the high n layers being made of $Si_3N_4$ and all of the low n layers being made of $SiO_2$. Traditionally, the last layer would have been a layer of low n, e.g., a 100 nm $SiO_2$ layer. However, in the embodiment of FIG. 3A, the top layer is made of a nano-laminate of ten bi-layers, each bi layer being made of a 5 nm nano-layer of $SiO_2$ and a 5 nm nano-layer of a material having refractive index closer to that of $SiO_2$ than that of $Si_3N_4$, which in this example is $Al_2O_3$, having refractive index of 1.67 when formed by sputtering. Consequently, the effective refractive index of the top layer 340 is: [(5*1.48)+(5*1.67)]/10=1.57, which is closer to the low index of $SiO_2$ than the high index of $Si_3N_4$.

Thus, in general, the embodiment of FIG. 3A provides an optical coating comprising a plurality of first layers having a first refractive index; a plurality of second layers having a second refractive index different from the first refractive index; wherein the plurality of first layers and the plurality of second layers are formed alternatingly in an interlaced manner over a substrate, terminating with one layer from the plurality of second layers; and a top layer formed over the one layer, the top layer comprising a nano-laminate having a plurality of bi-layers, each bi-layer comprising two nano-layers made of different materials, such that the effective refractive index of the top layer has a value closer to the first refractive index than the second refractive index. Also, the two different materials are chosen such that the expression $(n_1-n_2)/(n_1+n_2) \leq 0.07$ is satisfied, wherein $n_1$ and $n_2$ are the refractive indexes of the two different materials. It is also desirable that the resulting effective refractive index $n_{eff}$ of the top layer satisfies the expression $(n_{eff}-n_s)/(n_{eff}+n_s) \geq 0.10$, wherein $n_s$ is the second refractive index.

FIG. 3B illustrates. Another embodiment for optical coating, which would replace the structure of FIG. 3A. The embodiment of FIG. 3B provides increased durability, but also enables modifying the effective refractive index of the low refractive index layers. Specifically, in FIG. 3B all of the high n layers are standard layers, while all of the low n layers are nano-laminates. Layer 311 is made up of four bi-layers, each bi-layer having 5 nm nano-layer of $SiO_2$ and a 5 nm nano-layer of $Al_2O_3$, for a total of 40 nm. Layer 321 is made up of, e.g., three 5 nm nano-layer of $SiO_2$ interlaced with two 5 nm nano-layer of $Al_2O_3$, for a total of 25 nm. Layer 331 is made up of one bi-layers having 5 nm nano-layer of $SiO_2$ and a 5 nm nano-layer of $Al_2O_3$, for a total of 10 nm. Layer 340 is made up of ten bi-layers, each bi-layer having 5 nm nano-layer of $SiO_2$ and a 5 nm nano-layer of $Al_2O_3$, for a total of 100 nm. Consequently, while using standard ARC layers the high n would have been 2.02 and the low n would have been 1.48, in the embodiment of FIG. 3B the high n is still 2.02, but the low n is 1.57.

Alternatively, in order to keep the low refractive index closer to that of $SiO_2$, the bi-layers may be made of $SiO_2$ and SiON. SiON is formed by adding flow of nitrogen containing gas, such as $N_2O$. Depending on the flow of $N_2O$ during the fabrication, the refractive index of SiON can be tuned to 1.46-1.56. Thus, even at the high end, one obtains: (1.56−1.46)/(1.56+1.46)=0.03, which is well within the required 0.07. Similarly, the bi-layer may be made of $SiO_2$ and SiAlO. SiAlO has refractive index of about 1.50, so one obtains (1.50−1.46)/(1.50+1.46)=0.01, which is well within the required 0.07.

Thus, in general the embodiment of FIG. 3B provides an optical coating comprising a plurality of first layers having a first refractive index $n_1$; a plurality of second layers having a second refractive index $n_2$ different from the first refractive index; wherein the plurality of first layers and the plurality of second layers are formed alternatingly in an interlaced manner over a substrate; and wherein each of the plurality of second layers comprises a nano-laminate having at least one bi-layer, each bi-layer comprising a first nano-layer having a third refractive index $n_3$ and a second nano-layer having a fourth refractive index $n_4$, such that the effective refractive index of each nano-laminate equals the second refractive index, i.e., $n_{eff}=n_2$. In this respect, the effective refractive index satisfies the expression $|(n_{eff}-n_1)/(n_{eff}+n_1)| \geq 0.10$. The effective refractive index is a weighted average of the refractive indexes of the nano-layers, and can be expressed as: $n_{eff}=[(t_3*n_3)+(t_4*n_4)]/(t_3+t_4)$, wherein $t_3$ and $t_4$ are the thicknesses of the respective nano-layers. Also, the first nano-layer and the second nano-layer are selected such as to satisfy the expression: $|(n_3-n_4)/(n_3+n_4)| \leq 0.07$.

Figures 3C, 3D:
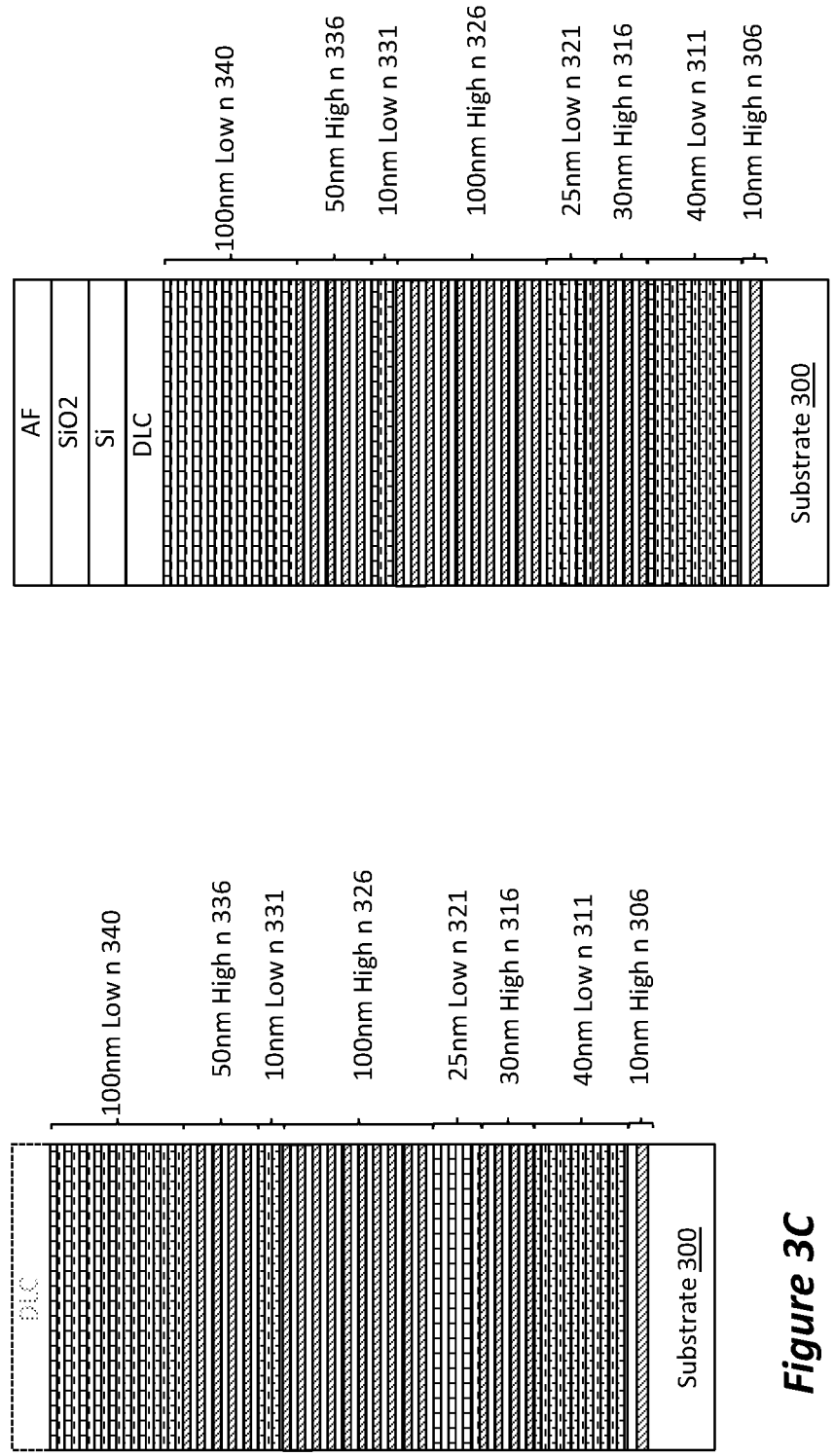
FIG. 3D illustrates an embodiment with a protective stack of DLC and anti-finger printing layers, with intermediate protective adhesion layers.

A further example of an optical coating is illustrated in FIG. 3C. In the embodiment of FIG. 3C all of the layers are nano-laminates. The low n laminates are the same as described with respect to FIG. 2B, but the high n layers have also been replaced with nano-laminates. In this example, the first layer, 306, is one bi-layer of one 5 nm AlN nano-layer and one 5 nm $Si_3N_4$. Layer 316 is a nano-laminate of three bi-layers, each bi-layer made up of one 5 nm AlN nano-layer and one 5 nm $Si_3N_4$. Layer 326 is a nano-laminate of ten bi-layers, each bi-layer made up of one 5 nm AlN nano-layer and one 5 nm $Si_3N_4$. Layer 336 is a nano-laminate of five bi-layers, each bi-layer made up of one 5 nm AlN nano-layer and one 5 nm $Si_3N_4$. Consequently, the effective refractive index of the high n laminates is [(5*2.02)+(5*2.15)]/10=2.085.

Thus, in general the embodiment of FIG. 3C provides an optical coating comprising a plurality of first layers having a first refractive index; a plurality of second layers having a second refractive index different from the first refractive index; wherein the plurality of first layers and the plurality of second layers are formed alternatingly in an interlaced manner over a substrate; wherein each of the plurality of first layers comprises a first nano-laminate having at least one bi-layer made of two nano-layers of different materials, such that the effective refractive index of the first nano-laminate equals the first refractive index; and wherein each of the plurality of second layers comprises a second nano-laminate having at least one bi-layer, each bi-layer comprising two nano-layer of different materials, such that the effective refractive index of the second nano-laminate equals the second refractive index.

Also, in general the embodiment of FIG. 3C provides an optical coating comprising a plurality of first layers having a first refractive index; a plurality of second layers having a second refractive index different from the first refractive index; wherein the plurality of first layers and the plurality of second layers are formed alternatingly in an interlaced manner over a substrate; wherein each of the plurality of first layers comprises an oxide nano-laminate having at least one oxide bi-layer made of a first oxide nano-layer and a second oxide nano-layer of different material than the first oxide nano-layer, such that the effective refractive index of the oxide nano-laminate equals the first refractive index; and wherein each of the plurality of second layers comprises a nitride nano-laminate having at least one nitride bi-layer made of a first nitride nano-layer and a second nitride nano-layer of different material than the first nitride nano-layer, such that the effective refractive index of the nitride nano-laminate equals the second refractive index.

The nano-layers need to have their material properties controlled, (stress, hardness, stoichiometry). For this purpose, reactive sputtered ion assisted deposition is the preferred approach. Reactive sputtering allows for rapid deposition of stoichiometric films and the ion assist part allows for atomic scale heating which helps control the stress, density and hardness of the deposited films. Also, by controlling the sputtering parameters and gas flow during the formation of the nano-layers, the refractive index can be adjusted so that the result of $(n_1-n_2)/(n_1+n_2)$ is less than 0.07 for the two nano-layers making up a bi-layer within a nano-laminate and the result of $(n_{1\mathit{eff}}-n_{2\mathit{eff}})/(n_{1\mathit{eff}}+n_{2\mathit{eff}})$ is greater than 0.1 for the effective indexes of the high and low nano-laminates.

The optical films may have high coefficient of friction, which means that, while they are very hard, they can be damaged by repeated abrasive contact. In order to protect the optical coating from abrasive wear, they may be coated with a lubricious film. This is shown by the dotted-line layers labeled DLC in FIGS. 3A-3C. In this example, the diamond-like coating (DLC) film is a highly hydrogenated DLC, having at least 20% hydrogen.

Additionally, for consumer display products, finger prints degrade the visual performance of the display. The final surface on these types of products should have an anti-smudge or anti-fingerprint (AF) coating. It is very difficult for fluorocarbon materials typically used for anti-fingerprint applications to adhere to DLC. To improve adhesion a two-layer film is used between DLC and AF coating. A thin silicon film is deposited over the DLC to protect the DLC from oxygen used to create the second SiO2 layer. The resulting stack is illustrated in FIG. 3D, but similar capping layers of DLC, Si, SiO2, and AF, can be formed on any of the embodiments of FIGS. 3A-3C.

As can be seen, the proposed coating comprises many thin layers of different materials and that are formed using different processes. It is preferable that all of the layers be formed on the substrate without exposing the substrate to atmosphere in between layers formation. Thus, the system should enable vacuum processing of all of the different layers. Since these processes require different environments, the system needs to include different sections, each tailored to provide a specific environment required for the process performed therein.

Figure 4A:
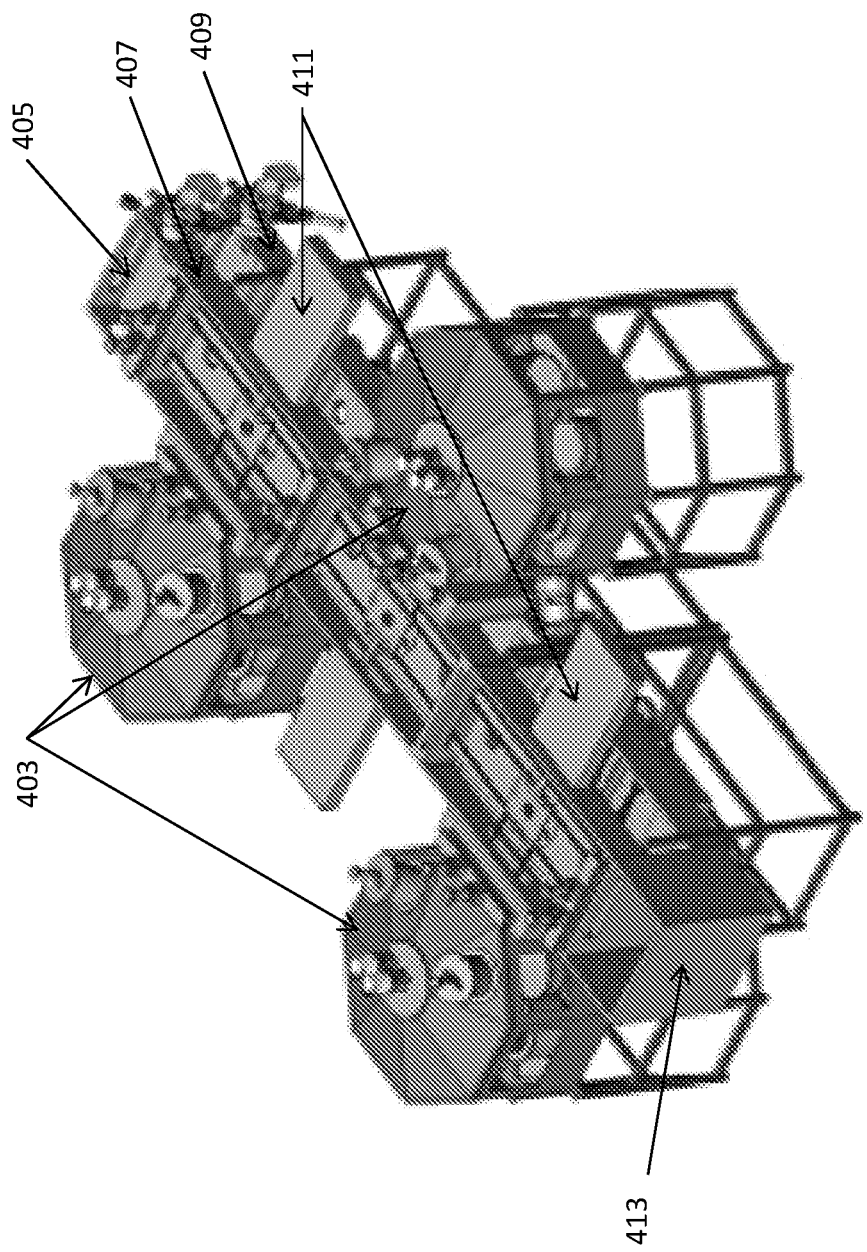
FIGS. 4A-4C illustrate an embodiment of a system for forming the optical coatings.

FIG. 4A illustrates an embodiment of a system for forming the optical coatings of the above embodiments, with some covers removed to expose interior elements. The system of FIG. 4A is modular, in that batch processing chambers 403 and linear processing sections 405 can be removed or added as needed. In the system of FIG. 4A the ARC layers are formed in the batch processing chambers 403, while any pre-treatment, the DLC and the oleophobic layers are done in the linear section 405. Specifically, in the embodiment of FIG. 4A the linear section 405 has an upper tunnel 407 and a lower tunnel 409, and the DLC and oleophobic and any other intervening layers can be formed in the lower tunnel 409, while any pre-treatment processing, e.g., plasma treatment, can be done in the upper tunnel. The substrates are mounted onto carriers and remain on the carrier throughout the entire processing in the system. The carriers are moved independently in the linear section 405, but moved together in unison in the batch processing chambers 403. The carriers are transported between the linear section 405 and the batch processing chambers 403 by the robot arms 411. The carriers are transferred between the upper tunnel 407 and the lower tunnel 409 via the elevator 413.

Figure 4B:
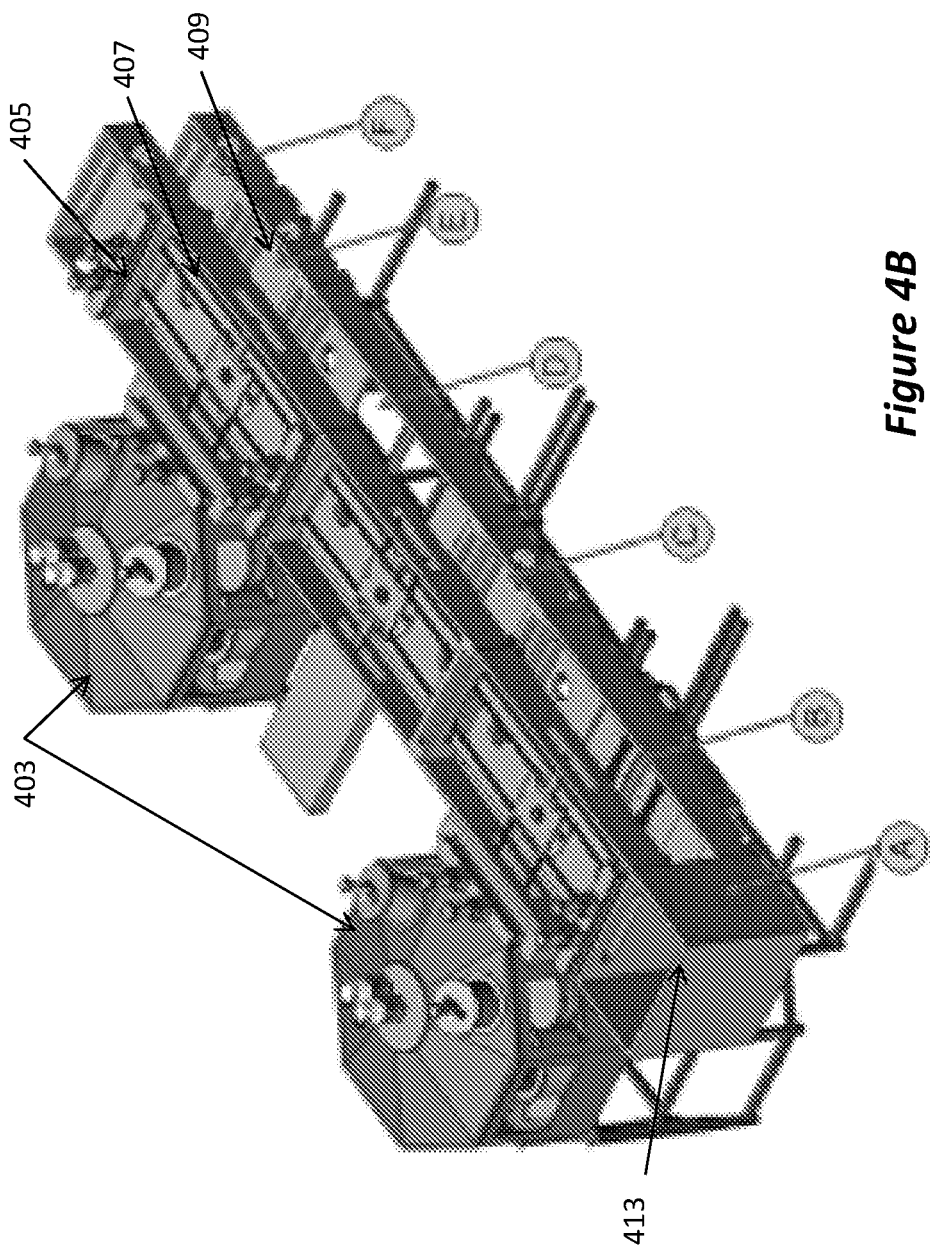

FIG. 4B illustrates the system of FIG. 4A, with one batch chamber and two robots removed, to enable visualizing the lower tunnel 409. Reference A refers to the elevator 413, while Reference B points to the location of the optical DLC sputtering chamber, which can be followed by other sputtering chambers for forming intervening layers. Reference C is a vacuum isolation chamber, while reference D points to a pass-by processing module, that can be used, e.g., to form the oleophobic layer. Reference E is a high vacuum load lock, while reference F is a rough vacuum load lock used to remove substrates from the system.

Figure 4C:
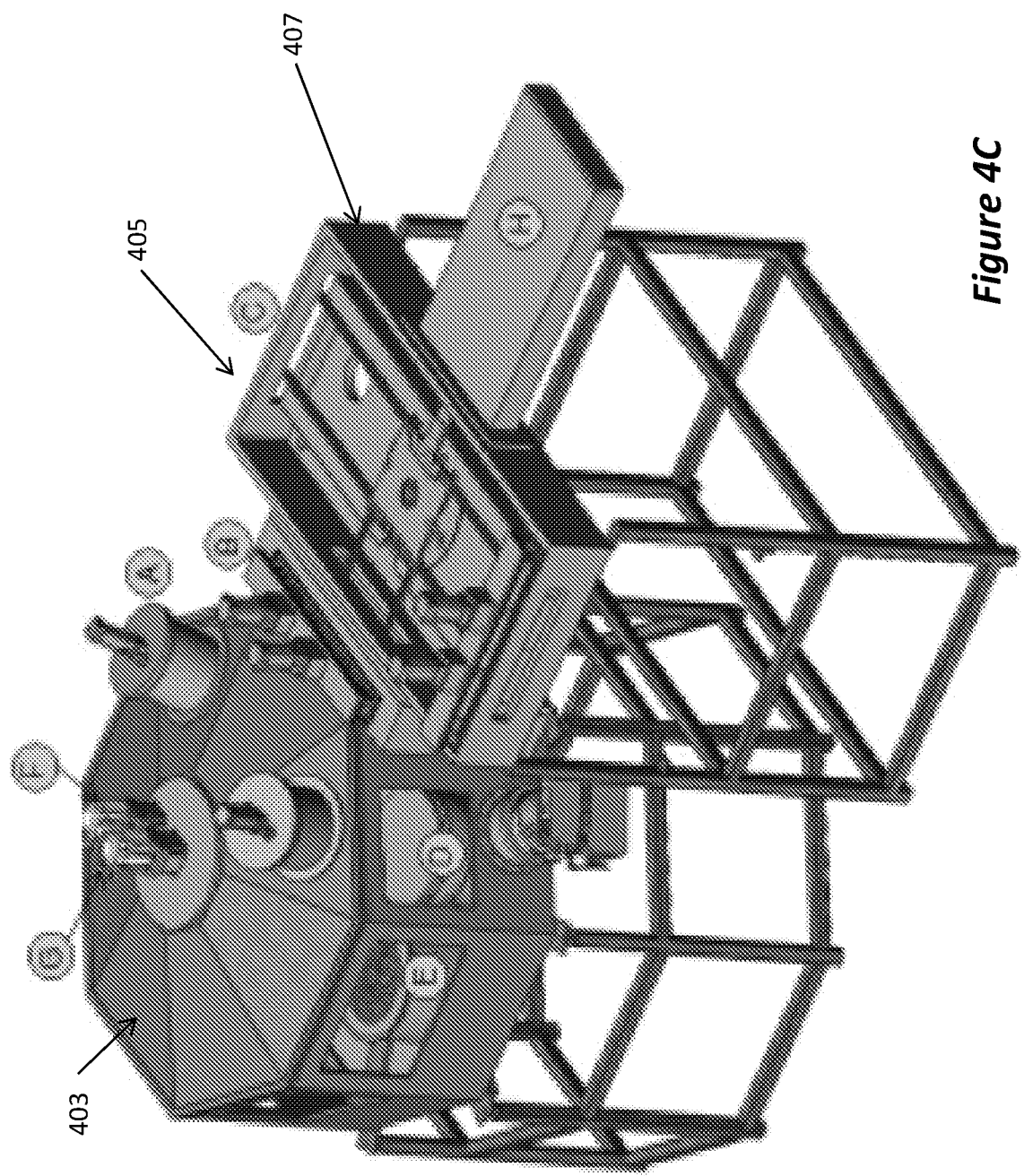

FIG. 4C illustrates the batch chamber and a linear section pair that forms the building block of the modular system of FIG. 4A (for clarity the lower tunnel is not shown). The system can be formed using as many of these pairs as needed, wherein FIG. 4A illustrates a system made of three pairs. As shown in FIG. 4A, each successive section is oriented at 180 degrees rotated orientation from the orientation of an adjacent pair.

The batch processing system supports a plurality of carriers and during processing rotate the carriers about a central axis. Additionally, the carriers spin about their own axis. As the carriers rotate about the chamber's axis, the substrate passes through multiple processing stations so as to form the various layers making up the ARC coating. In the example of FIG. 4C two processing stations are included in each batch processing chamber, each station having one sputtering source having a shutter and one ion source to form the IBAD processing. In operation, only one shutter is opened at a time, such that when the carriers rotate about the chamber's axis all of the substrates are sputtered successively by the operating sputtering station to form one layer. Each substrate makes multiple passes over the sputtering source to build up the proper thickness of the layer. When the layer thickness has been reached, the open shutter is closed and the other shutter is opened and the process proceeds to form the second layer. In this manner, two different layers can be deposited on the substrate alternatingly so as to form the ARC.

For example, a first batch processing system may have one sputtering source having a silicon target and one sputtering source having a niobium target, and a supply of oxygen gas. Once the carriers are loaded, the shutter of the niobium source is opened and oxygen is flown so as to form a first layer of NbO. Then the shutter of the niobium source is closed and the shutter of the silicon is opened so as to form a layer of SiO2. Once the proper thickness of SiO2 is formed on all the substrate, the silicon shutter is closed and the niobium shutter is opened to form the next NbO layer, and so on until the entire stack of the ARC is completed.

If one wishes to form the structure shown in FIG. 1B, then another batch system is employed, wherein one target is of silicon and one target is of aluminum, and a source of nitrogen gas is provided. The process then alternates between having the shutter of the silicon target open to form a layer of SiN and the aluminum target shutter open to form the layer of AlN. If the structure shown in FIG. 1C is desired, then a gas supply of oxygen is used to form alternating layers of SiO2 and $Al_2O_3$. So, if one wishes to make a structure having layers 5, 4, 3, 2', and 1', then the system should have three batch processing systems, with three linear sections.

In FIG. 4C reference A shows the two Meissner traps that maintain vacuum within the batch processing chamber. Reference B shows the slot valve that separates the vacuum environment in the batch processing chamber 403 and the vacuum environment in the linear section 405. Reference C is the linear transport section 405. In FIG. 4C two covers are removed to expose the sputtering source D and the ion source E for the IBAD processing. A feature of this arrangement is that while the batch processing system utilizes a "planetary" arrangement, wherein wafers are being rotated about the central axis of the chamber, the carriers can be loaded and unloaded serially and in vacuum onto the planetary system without having the expose the batch processing chamber to the atmosphere. Moreover, processes that are not compatible with the batch processing system, such as the DLC and oleophobic layers, can be done in the linear section on one substrate at a time.

Reference F is the carrier spin rotation motor and reference G is the main orbital rotation motor. That is, motor G rotates all of the carriers at an orbit about the central axis of the batch chamber, while motor F rotates each of the carriers about its own axis. Such an arrangement is referred to as a planetary chamber, as the carriers rotate about the central axis of the chamber just as planets orbit about the sun, while each carrier also spins about its own axis just like plates spin about their own axis. Thus, it can be said that the system is made up of pairs of planetary chambers coupled to linear transport section wherein carriers, which function as planets, can be transferred in vacuum between the planetary chamber and its coupled linear section. Thus, the carriers undergo both a planetary motion and a linear transport motion. Reference H illustrates the carrier loader which is used to transport carriers between the batch chamber and the linear section without exposure to the atmosphere.

In the system of FIGS. 4A-4C when the carrier is processed in the batch processing chamber, it makes multiple passes in front of each sputtering source. Conversely, when the carrier is in the linear section, it makes a single pass in each processing chamber. Also, when the carrier is in the batch processing system it moves in unison with other carriers within the planetary motion system, while when the carrier is in the linear transport section it moves independently of other carriers within the linear transport section. When processing is completed in one of the batch processing system, the planetary rotation system brings the carriers one at a time to the location of the slot valve, and the robot arm removes the carriers one by one and places them in the linear transport section. The robot may exchange the processed carriers with fresh carriers to be processed.

FIGS. 5A-5D illustrate an embodiment of the carrier, wherein FIG. 5A is a bottom view, FIG. 5B is a side view, FIG. 5C is a top view, and FIG. 5D is an isometric view. As shown in FIG. 5C, the carrier has a top plate 505 that is configured to support the substrates 510. Different top plates can be configured to support one large or several small substrates 510. Thus, by merely exchanging the top plate of the carrier the system can be converted to process substrates of different sizes.

The carrier is transported throughout the system by the transport section 515, and the top plate 505 is attached to the transport section 515 via the rotation section 520. While inside the batch processing chamber, a linkage from the motor F (see FIG. 4C) engages the rotation section 520 to thereby impart spin rotation of the top plate about its own axis. The construction of the carrier having a transport section and a top plate enables the carrier to be transported individually in the linear section and also be rotated in the batch processing chamber. The rotation section 520 also can provide engagement mechanism for the robot arm 411 to transport the carrier from the linear section to the batch processing chamber.

Figure 6A:
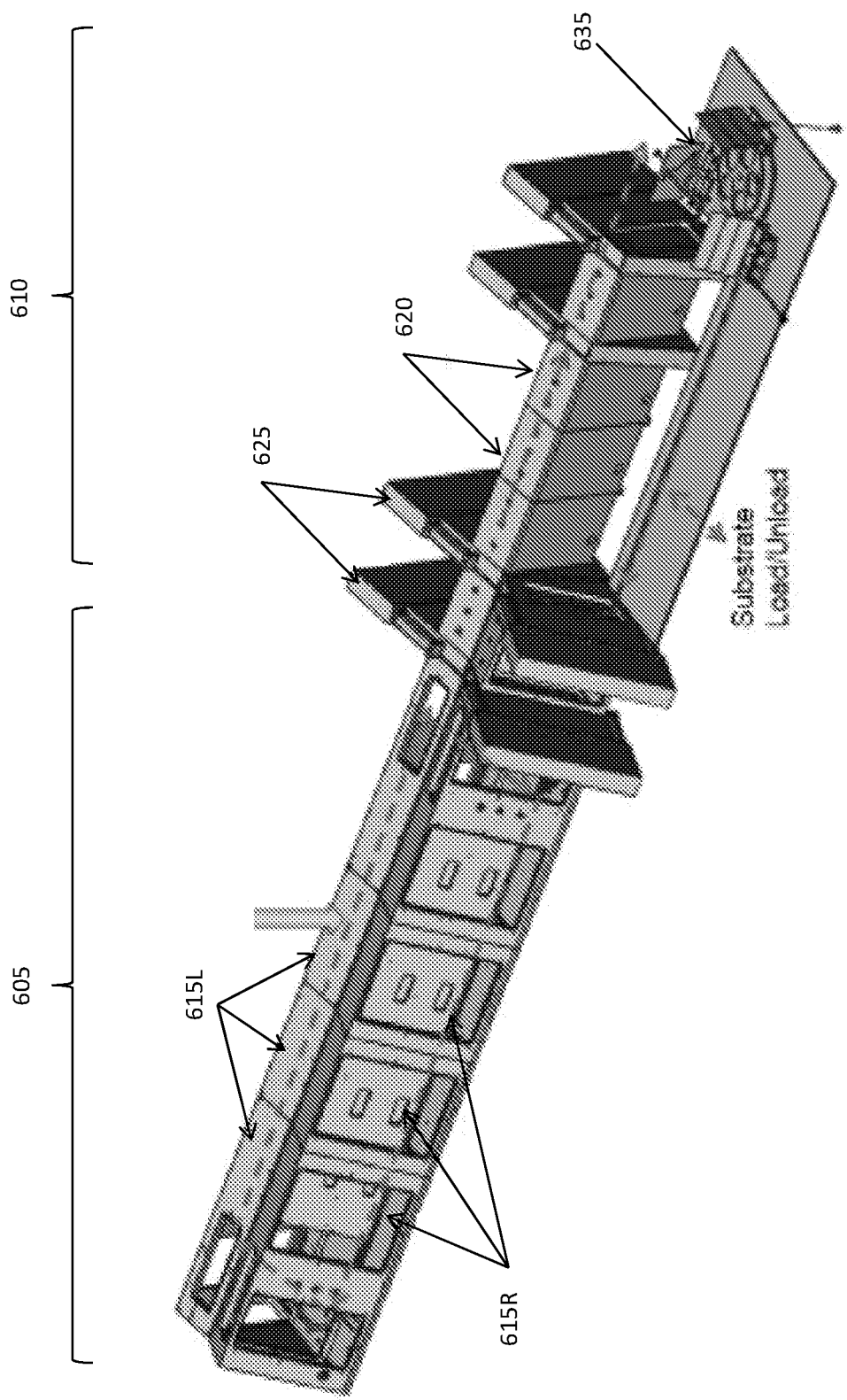
FIGS. 6A and 6B illustrate an embodiment of a system for forming the optical coatings.
Figure 6B:
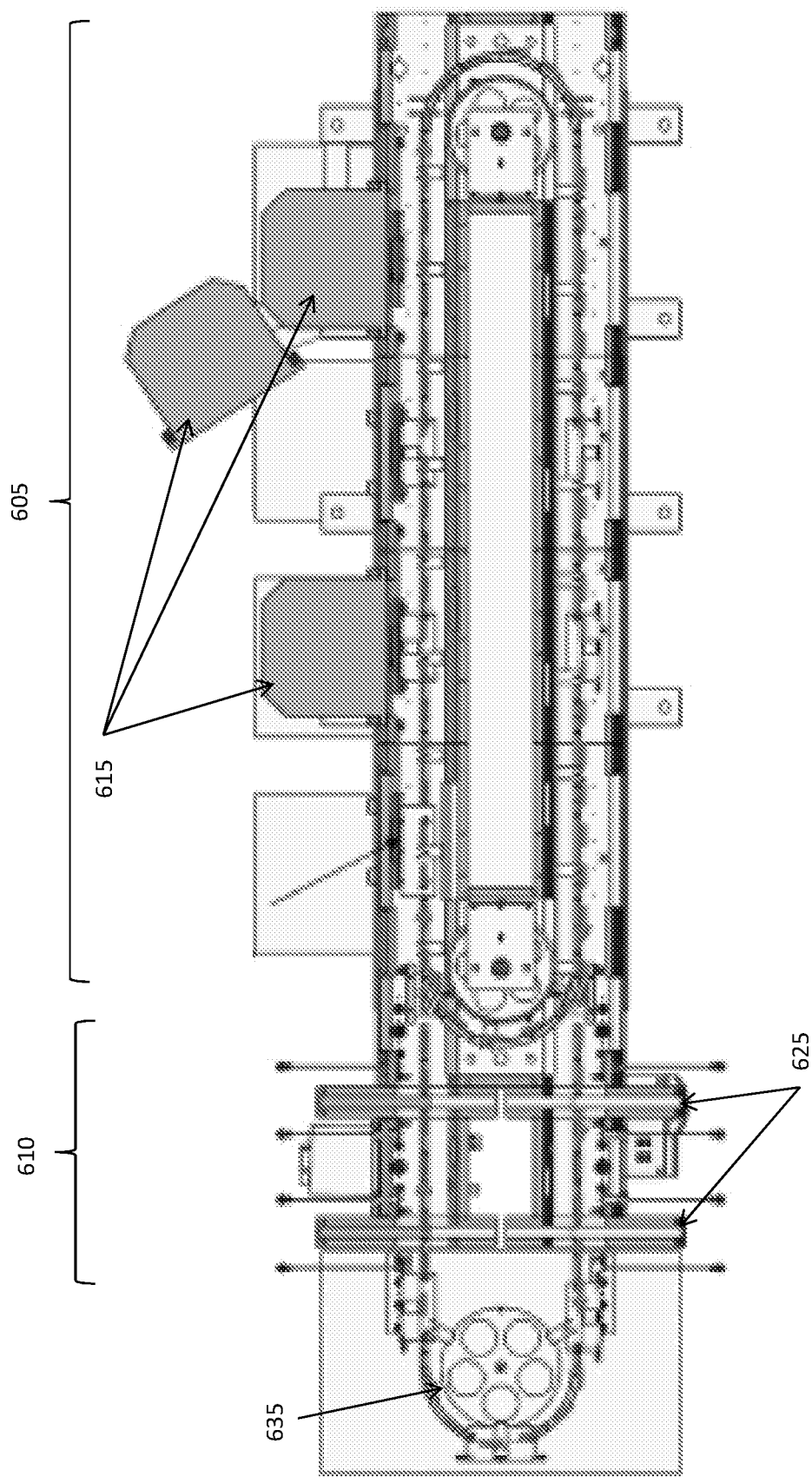

FIGS. 6A and 6B illustrate an embodiment of a linear transport system for forming the optical coatings of the disclosed embodiments. FIG. 6A is a perspective view, while FIG. 6B is a top cross-section view. In the embodiment of FIGS. 6A and 6B pairs of processing chambers are arranged side-by-side to form a batch processing section 605, and a series of processing chambers are arranged in a single file to form single carrier processing section 610. In the batch processing section 605 the chambers 615 can be added or removed in pairs, to enlarge or reduce the size of the section 605. In the single carrier processing section 610 the chambers 620 can be added or removed individually to enlarge or reduce the size of section 610. In the batch processing section there are no isolation valves between successive chambers, such that carriers can continuously pass through the successive chambers in a race-track course, such that each carrier performs multiple passes in each chamber 615. Conversely, isolation valves are provided between the chambers 620 of the linear processing sections, and each carrier performs only a single pass in each of chambers 620.

The batch section 605 can be used to form the multiple nano-layers of the ARC, while the single carrier processing section can be used to form the DLC, intervening layers, and the oleophobic coatings, which are incompatible with the vacuum requirements of the ARC forming chambers. Thus, at least one of chambers 615 should be an IBAD processing chamber, while at least one of the chambers 620 should be an evaporative processing chamber. Incidentally, FIG. 6B illustrates the middle chamber 615 open to enable service of the system.

The broken-line arrows in FIGS. 6A and 6B show the transport of the carriers in each section. In the batch processing section 605 the carriers follow a race-track type course, to thereby visit each processing chamber 615 several times. The batch processing section may have several IBAD stations 615, wherein each station has a target of one material, as described with respect to the batch processing of FIGS. 4A-4C. Each sputtering source has a shutter and one or more shutters may be open at a time, depending on the sputtering target and the thickness of the layer desired. Since no isolation valves are provided between the chambers 615, it is preferable that when one shutter is open, the shutters of the two immediately adjacent chambers are closed, so as not to have cross-sputtering.

Once the carriers have processed through the race-track sufficient number of times to form the ARC layers, they exit the race track, one at a time through a load lock 625, and proceed to the single file linear processing section 610 for post processing, e.g., forming of DLC and oleophobic layers. When the carrier completed its post processing, the carrier exits the load lock into a turn table that sends the carriers onto the load/unload section.

Throughout the system the carriers ride freely on a single track, but the motive force is applied differently in the batch processing section 605 and in the single file linear processing section 610. Specifically, in the batch processing section 605 the single track is in the form of oval race-track shape, and a conveyor belt driven by a single motor engages all of the carriers within the race track and moves all of the carriers together in unison. Conversely, in the single file linear processing section 610, the single track is in the form of a straight monorail and individual magnetic wheels engage the carriers, such that each carrier can be moved individually and independently of the other carriers. In this manner, while in the batch processing system a pass-by processing is performed, in the linear section a static processing is performed, wherein the carriers stop inside the processing chamber 620 and processing is done while the carrier is stationary.

One feature of the batch processing shown in FIGS. 6A and 6B, is that there is no line of sight among opposing chambers 615 within the batch processing section 605. To clarify, in FIG. 6A the opposing chambers are identified as 615L and 615R, i.e., each chamber 615L is paired with a corresponding chamber 615R. Thus, one shutter of chamber 615L may be opened, and at the same time the shutter of its opposing chamber 615R may also be opened, wherein no direct line of sight exists between these two chambers, such that particles from one chamber cannot be mixed with those of the opposing chamber. This, of course, is not the case for a planetary batch processing chamber.

As with the embodiment of FIGS. 4A-4C, the batch processing section 605 can be used to form the ARC, while the linear section can be used to form the DLC, intervening layers, and oleophobic coating. In the example of FIGS. 6A and 6B, four pairs of chambers 615 are shown. Thus, two pairs can be used to form the nano-layers of the low n layers, while two pairs can be used to form the two nano-layers of the high n layers. For example, first opposing pair may have an aluminum target with nitrogen gas supply, a second opposing pair can have silicon target with nitrogen gas supply, a third opposing pair can have aluminum target with oxygen gas supply, and a fourth opposing pair can have silicon targets with oxygen gas supply. Under such an arrangement, the shutter of the first opposing pair can be opened to form the AlN nano layers, the shutter of the second pair can be open to form the $Si_3N_4$ nano-layers, the shutter of the third pair can be opened to form the $Al_2O_3$ nano-layers, and the shutter of the fourth pair can be opened to form the $SiO_2$ nano-layers. In this manner, during fabrication of each nano-layer two sputtering stations operate simultaneously and each carrier can perform multiple passes in each of the operating sputtering station.

Once the nano-layers have been fully formed, the carriers exit the batch processing section 605 and are transported individually into the linear processing section 610, wherein the DLC, intervening layers and oleophobic layers can be formed in chambers 620. Chambers 620 can be isolated from each other by gate valves 625 (only a few of which are shown). Chambers 620 may be static or pass-by processing stations. In one embodiment the DLC chamber is a static processing chamber while the oleophobic evaporation chamber is a pass-by chamber. As illustrated in FIG. 6A, once processing in the linear processing section 610 is completed, the carriers exit to carousel 635, which transport the carriers onto the load/unload section, wherein the processed substrates are unloaded from the carriers, while fresh substrates are loaded onto the carriers.

FIGS. 6C-6E illustrate a carrier that may be used in the above described systems. In this example the carrier has two rotatable top plates 630 attached to a transport base 635 via rotation section 640. The substrates 650 are mounted on the top plate 630 in a vertical orientation. One feature of this embodiment is that no motive force is needed to impart spin to the top plate, thus eliminating the need for motor F and the linkages. Instead, the rotation section 640 includes a metallic rod 642 which engages magnetic bar 645. As the transport base 635 moves, the metallic rod 642 runs along the magnetic bar 645, which causes it to spin, thereby rotating the substrates mounted onto the top plate 630.

Using the above described system, a method for fabricating a coating onto glass substrates is provided, wherein the method comprises the steps of: loading the substrates onto a plurality of carriers; transporting the plurality of carriers into a batch processing chamber having a plurality of sputtering sources; transporting the plurality of carriers in unison inside the batch processing chamber so as to pass each of the carriers in front of the sputtering sources multiple time to thereby form multiple layers of an anti-reflective coating (ARC) on the substrate; transporting the carriers, one at a time, onto a linear transport section comprising a plurality of linear processing chambers, each of the linear processing chambers configured to process a single carrier at a time; operating at least one of the linear processing chambers to form a diamond-like coating (DLC) over the ARC; operating at least one of the linear processing chambers to form an oleophobic layer over the DLC. The process may include successively opening shutters of the plurality of sputtering sources one at a time during the process of batch processing the carriers to form the ARC.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

The invention claimed is:

1. A method for fabricating a coating onto glass substrates, comprising:
  loading the substrates onto a plurality of carriers;
  transporting the plurality of carriers into a batch processing chamber having a plurality of sputtering sources;
  transporting the plurality of carriers in unison inside the batch processing chamber so as to pass each of the carriers in front of the sputtering sources multiple time to thereby form multiple layers of an anti-reflective coating (ARC) on the substrates transporting the carriers, one at a time, onto a linear transport section comprising a plurality of linear processing chambers, each of the linear processing chambers configured to process a single carrier at a time;

operating at least one of the linear processing chambers to form a diamond-like coating (DLC) over the ARC; and, operating at least one of the linear processing chambers to form an oleophobic layer over the DLC.

2. The method of claim 1, further comprising successively opening shutters of the plurality of sputtering sources one at a time during the process of batch processing the carriers to form the ARC.

3. The method of claim 2, further comprising spinning the carriers during the batch processing.

4. The method of claim 1, wherein forming multiple layers comprises forming multiple alternating nano-layers of alternating effective refractive index, each nano-layer made to a thickness of no more than 30 nanometer.

5. The method of claim 1, wherein forming multiple layers comprises forming multiple alternating nano-layers of alternating effective refractive index, each nano-layer made to a thickness of no 2-10 nanometer.

6. The method of claim 1, wherein forming multiple layers comprises forming multiple alternating nano-layers of alternating effective refractive index made of AlN, $Si_3N_4$, $Al_2O_3$, and SiO.

* * * * *